(12) United States Patent
Zimmermann

(10) Patent No.: US 6,307,768 B1
(45) Date of Patent: Oct. 23, 2001

(54) BITLINE TWIST WITH EQUALIZER FUNCTION

(75) Inventor: Ulrich Zimmermann, Mechanicsville, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 09/751,477

(22) Filed: Dec. 28, 2000

(51) Int. Cl.[7] ........................................... G11C 5/02
(52) U.S. Cl. .................. 365/51; 365/63; 365/72; 365/190; 365/202; 365/206; 365/210
(58) Field of Search ................... 365/51, 63, 72, 365/190, 202, 203, 206, 210

(56) References Cited

U.S. PATENT DOCUMENTS

| | | | | |
|---|---|---|---|---|
| 5,949,698 | * | 1/1999 | Shirley | 365/51 |
| 6,097,620 | * | 8/2000 | Naritake | 365/63 |
| 6,111,774 | * | 8/2000 | Shirley | 365/51 |
| 6,163,475 | * | 12/2000 | Proebsting | 365/63 |

* cited by examiner

Primary Examiner—Andrew Q. Tran
(74) Attorney, Agent, or Firm—Stanton C. Braden

(57) ABSTRACT

A semiconductor device includes a plurality of bitlines arranged in an array, the plurality of bitlines being grouped in pairs and at least some of the bitlines include a twist. A twist region is disposed along the plurality of bitlines wherein the twist region occupies layout area designated for the twists. An equalizer element is disposed in the twist region for equalizing a pair of bitlines.

22 Claims, 6 Drawing Sheets

BITLINE TWIST WITH EQUALIZER FUNCTION

BACKGROUND

1. Technical Field

This disclosure relates to semiconductor devices, and more particularly, to a semiconductor memory device with bitline equalization in twisted bitline regions.

2. Description of the Related Art

Many current dynamic random access memory (DRAM) devices employ bitlines (BL) for reading and writing data to storage capacitors of memory cells. Many DRAM designs employ a bitline for each 512 memory cells (e.g., 512 bits/BL). To reduce bitline to bitline coupling effects, a bitline twist is introduced. These twists consume layout space.

Referring to FIG. 1, a schematic diagram of semiconductor memory bitline architecture is illustratively shown. The bitline architecture shows a memory array 10 having a plurality of bitlines 12. Bitlines 12 are paired. Each pair of bitlines includes a bitline true (BLt) and a bitline complement (BLc). Each pair is indexed in FIG. 1 to designate the pair, e.g., $BLc_i$ and $BLt_i$, where i =1, 2, 3, ... for pair number 1, pair number 2, etc. Each pair is coupled to a sense amplifier (SA) 14. Every other BL pair includes a twist 16. Twists 16 are employed to reduce bitline coupling between adjacent bitlines, i.e., a portion of BLt's and BLc's are separated from adjacent or nearby BLt's and BLc's to prevent cross-talk when the adjacent or nearby BLt's and BLc's are simultaneously activated. In one example, the layout area consumed by twists 16 includes a width of 6 times the pitch of a wordline 18. Wordlines 18 in a region 20 are dummy wordlines, which are inactive as a consequence of twists 16 in this region. The twist region 20 has no active functionality, it merely serves to cross true and complement BL's every other BL-pair.

Because sense amplifiers 14 sense charge differences between BL's, the BL's need to be equalized after each active cycle. Equalizing transistors 22 are connected across each pair of BL's (e.g., $BLc_1$ and $BLt_1$). Transistors 22 are activated by an equalize signal (EQU) to permit conduction between each pair of BL's before the next active cycle of the BL's. Transistors 22 are located near sense amplifiers 14 on one end of each pair of BL's 12. The time needed to equalize the BL's, especially for long bitlines (e.g., 512 bits/BL architectures), before the next activate (ACT) command can be issued limits chip performance.

Referring to FIG. 2, an illustrative timing diagram is shown for employing BL's. The following signals are represented: a global clock signal (CLK), a row address strobe (RAS), a column address strobe (CAS) a write enable (WE), an address line (ADR) and an output line signal (DQ). The following command are also shown: activate (ACT), precharge (PRE), write (WRT) and read (READ). tRP (or row address strobe (RAS) to Precharge) represents the time it takes to equalize BL's before the ACT command.

Therefore, a need exists for reducing the time needed to equalize bitlines without chip layout penalty. A further need exists for a layout, which employs the inactive region caused by bitline twists.

SUMMARY OF THE INVENTION

A semiconductor device of the present invention includes a plurality of bitlines arranged in an array, the plurality of bitlines being grouped in pairs and at least some of the bitlines include a twist. A twist region is disposed along the plurality of bitlines wherein the twist region occupies layout area designated for the twists. An equalizer element is disposed in the twist region for equalizing a pair of bitlines.

In other embodiments, the equalizer element preferably includes a transistor coupled between a pair of bitlines. The device may include additional equalizer elements disposed near sense amplifiers of the plurality of bitlines, the additional equalizer elements being located outside the twist region. The additional equalizer elements preferably include transistors. The twist region is preferably centrally disposed along a length of the plurality of bitlines and the equalizer element and the additional equalizer element each equalize the pair of bitlines. The device may include a plurality of equalizer elements wherein the equalizer elements and the additional equalizer elements are enabled by a same equalize signal. The equalizer element may include a dummy component of the semiconductor device adapted to perform an equalizing function for the pairs of bitlines. The twist region may includes a longitudinal axis disposed substantially perpendicular to a length of the bitlines. The twist region may include a width perpendicular to the longitudinal axis and occupies an area of at least one wordline pitch. Every other pair of bitlines may include a twist, or all of the pairs of bitlines may include a twist.

Another semiconductor device of the present invention includes a plurality of bitlines arranged in an array, the plurality of bitlines being grouped in pairs and at least some of the pairs of bitlines include a twist. A twist region is disposed along the plurality of bitlines wherein the twist region occupies layout area designated for the twists. A first equalizer element is disposed in the twist region for equalizing a pair of bitlines. A second equalizer element is disposed in the twist region for equalizing bitlines between pairs of bitlines.

In other embodiments, the first equalizer element may include a transistor coupled between each pair of bitlines. Each pair of bitlines may include a true bitline and a complement bitline, and the second equalizer element may include a transistor coupled between two adjacent true bitlines or two adjacent complement bitlines. A third equalizer element may be disposed near a sense amplifier of the plurality of bitlines, the third equalizer element being located outside the twist region. The third equalizer element preferably includes a transistor. The first, second and third equalizer elements are preferably enabled by a same equalize signal. The twist region is preferably centrally disposed along a length of the plurality of bitlines and the first and second equalizer elements each equalize the pair of bitlines. The first equalizer element may include a dummy component of the semiconductor device adapted to perform an equalizing function for the pairs of bitlines. The second equalizer element may also include a dummy component of the semiconductor device adapted to perform an equalizing function for the pairs of bitlines. The twist region preferably includes a longitudinal axis disposed substantially perpendicular to a length of the bitlines. The twist region may include a width perpendicular to the longitudinal axis and occupy an area of at least about one wordline pitch.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides an architecture or layout, which employs the inactive region caused by bitline twists by placing equalizing transistors in this region. The centrally located position of the equalizing transistors permits a significant reduction in equalizing time and reclaims layout area normally not used due to the bitline twists. Advantageously, by employing the present invention, chip performance is increased, and chip layout penalty is reduced. The present invention will be described in terms of an illustrative dynamic random access memory (DRAM) device. However, the present invention should not be construed as limited to the described architecture or device type, as other architectures (e.g., multiple twist regions between two sense amplifier banks, multiple equalize transistors per bitline pair, bitline twists for all bitline pairs, etc.) and device types (e.g., synchronous DRAM, embedded DRAM, static RAM (SRAM), etc.) are also contemplated.

Figure 3:
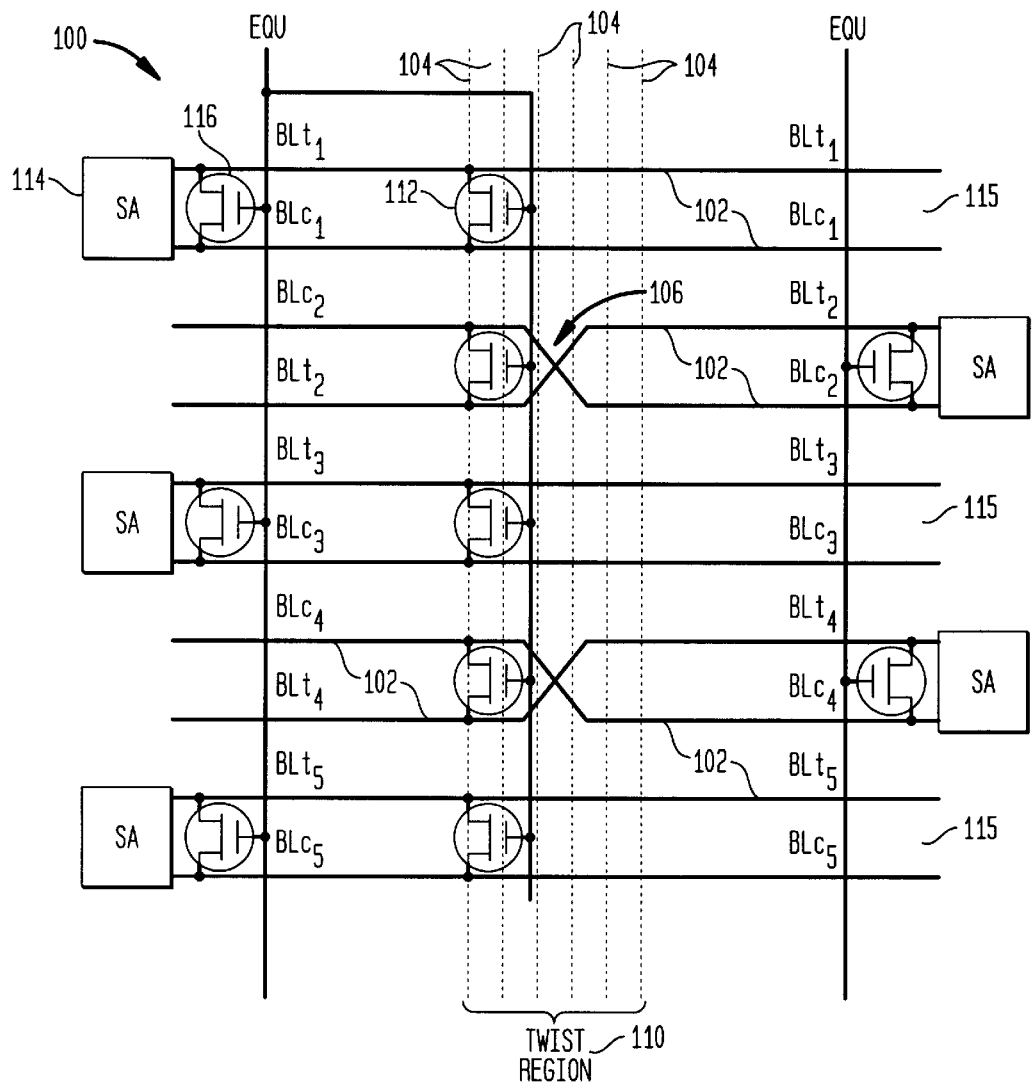
FIG. 3 is a schematic diagram showing a bitline architecture with equalizing elements in a twist region in accordance with the present invention.

Referring now in specific detail to the drawings in which like reference numerals identify similar or identical elements throughout the several views, and initially to FIG. 3, a schematic diagram of a memory array 100 is shown in accordance with one embodiment of the present invention. Memory array 100 includes a plurality of memory cells (not shown) which are selectively connected to bitlines 102 to read or write data thereto. Wordlines 104 are employed to activate an access transistor (not shown) for each memory cell to permit a write or read operation to be performed to either charge or discharge a storage capacitor (not shown) of the memory cell, as is known in the art.

Figure 6:
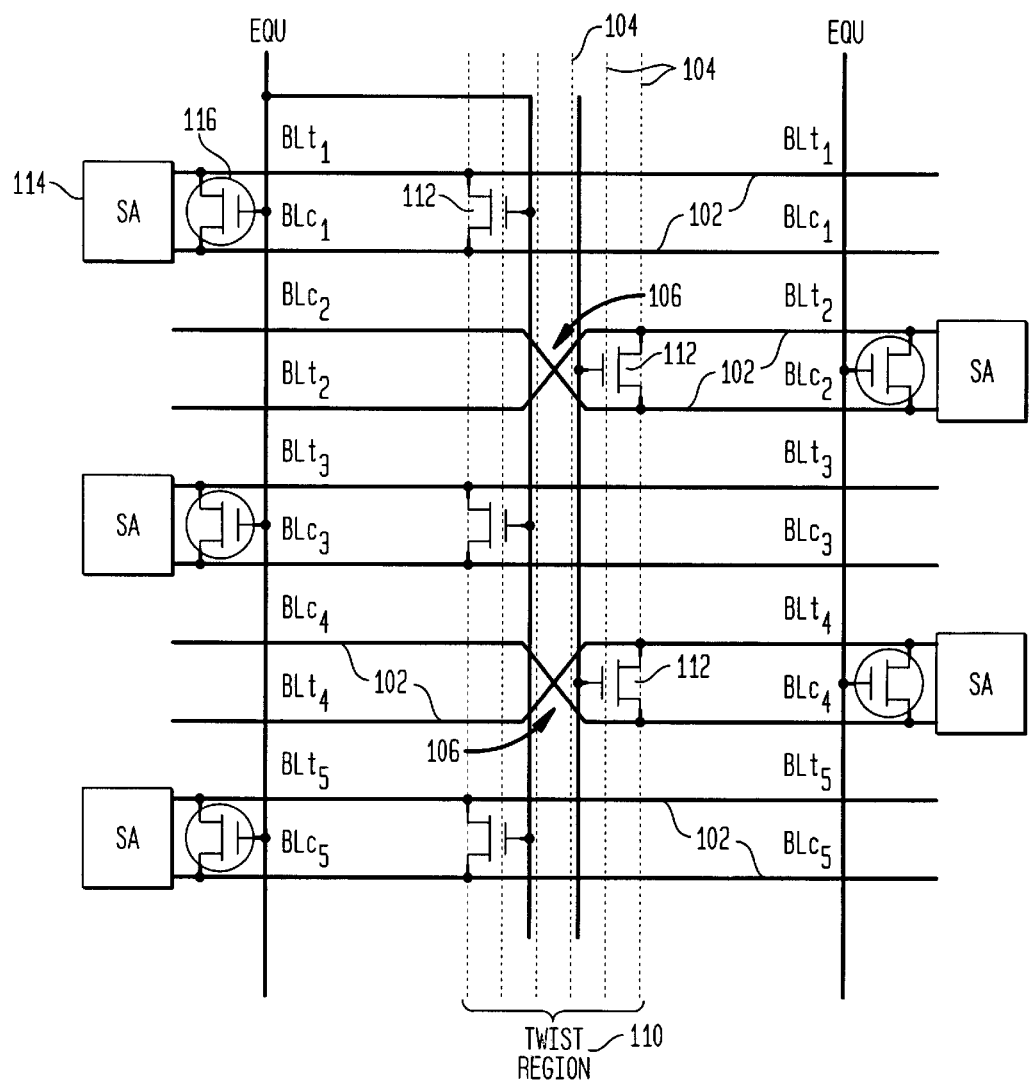
FIG. 6 is a schematic diagram showing a bitline architecture with equalizing elements on both sides of a twist region in accordance with the present invention.
Figure 7:
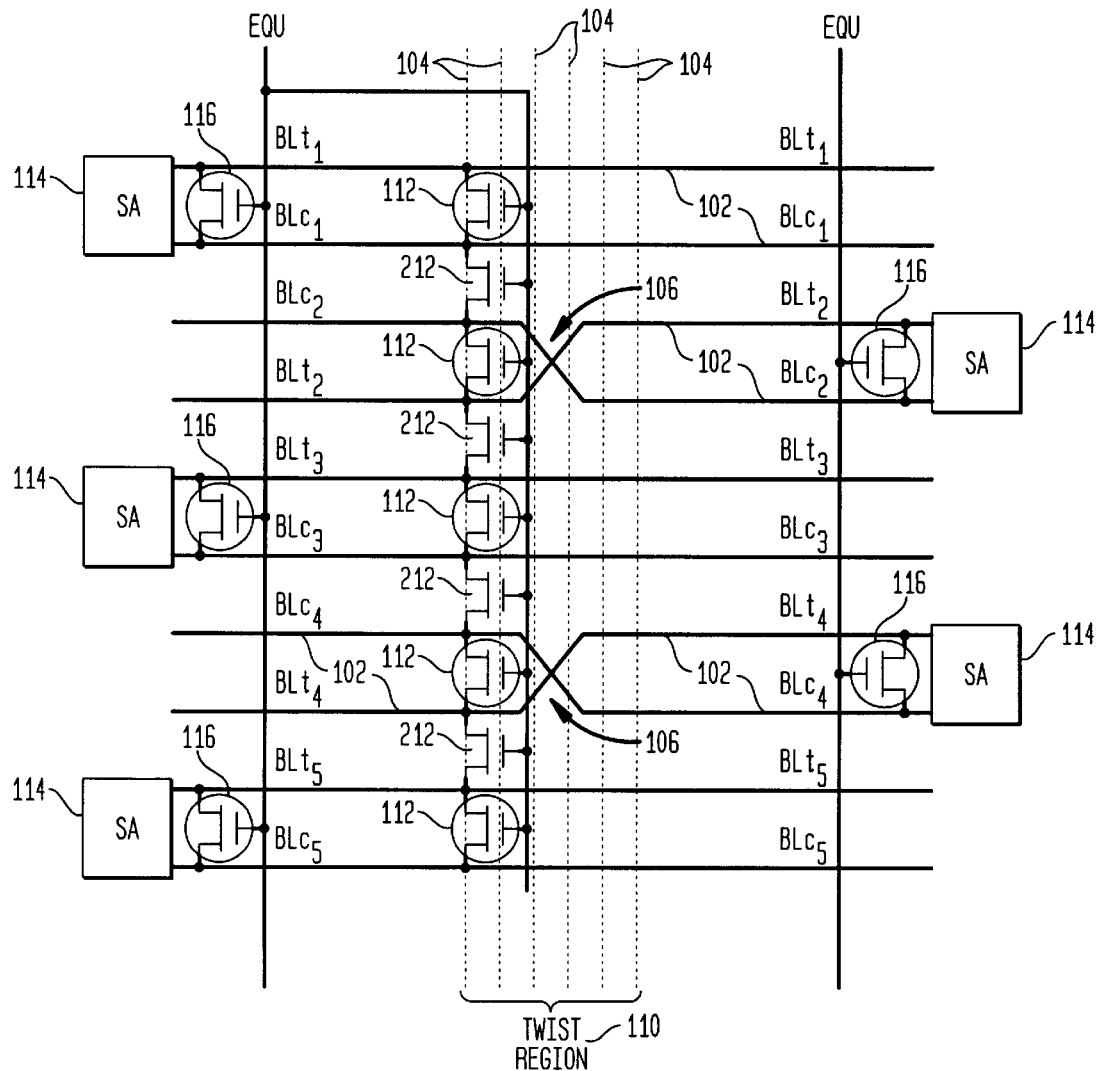
FIG. 7 is a schematic diagram showing a bitline architecture with equalizing elements between bitline pairs and between adjacent bitline pairs in a twist region in accordance with the present invention.

Bitlines 102 are paired. Each bitline pair includes a bitline true (BLt) and a bitline complement (BLc) as illustratively shown in FIG. 3 (FIG. 6, and FIG. 7). Each pair is indexed in the FIGS. to designate the pair, e.g., $BLc_i$ and $BLt_i$, where i =1, 2, 3, . . . for pair number 1, pair number 2, etc. Each bitline pair is coupled to a sense amplifier (SA) 104 at one end of bitline 102. In this example, every other BL pair includes a twist 106. However, in other embodiments, all bitlines may be twisted or multiple twist regions may be included between two sense amplifier banks. As described above, twists 106 are employed to reduce bitline coupling between adjacent bitlines, e.g., a portion of BLt's and BLc's are separated from neighboring pairs to prevent cross-talk when adjacent or nearby BLs are simultaneously activated. In one example, the layout area consumed by twists 106 includes an integer multiple of wordline pitch, e.g., 6 times the pitch of a wordline 104. The layout area consumed by twists 106 may also include non-integer multiples of wordline pitch.

Sense amplifiers 114 sense charge differences between bitline pairs (BLt and BLc). The bitlines need to be equalized after each active cycle. In accordance with the present invention, equalizing elements 112 (e.g., transistors, switches, or other selective connection)) are connected across each pair of BL's (e.g., BLc and BLt) in twist region 110. In this embodiment, transistors 116 are disposed near each sense amplifier 114. Transistors 112 and 116 are activated by an equalize signal (EQU) to permit conduction between each pair of bitlines 102 before the next active cycle of the bitlines 102. Transistors 112 and 116, when conducting, short BLt's and BLc's of each bitline pair. In one embodiment, the number of transistors 112 may be increased in region 110, and transistor 116 may be omitted. Alternately, transistor 116 can be omitted without increasing the number of transistors 112. In other embodiments, multiple equalize transistors per bitline pair may be employed. Advantageously, in accordance with the present invention, transistors 112 may employ dummy devices normally found in a region 110. In other words, access transistors which are inactive because of their location in twist region 110 and which would have otherwise been employed with memory cells may be adapted as equalization transistors 112. Alternately, transistors 112 may be formed during the fabrication of transistors 116 of memory array 100, by processes known in the art.

Transistors 112 and 116 conduct as controlled by EQU and, as such, provide multiple electrical paths between bitline pairs (BLt and BLc). Although one transistor 112 is shown for each bitline pair, multiple transistors may also be employed to couple the bitline pairs in accordance with EQU.

Figure 1:
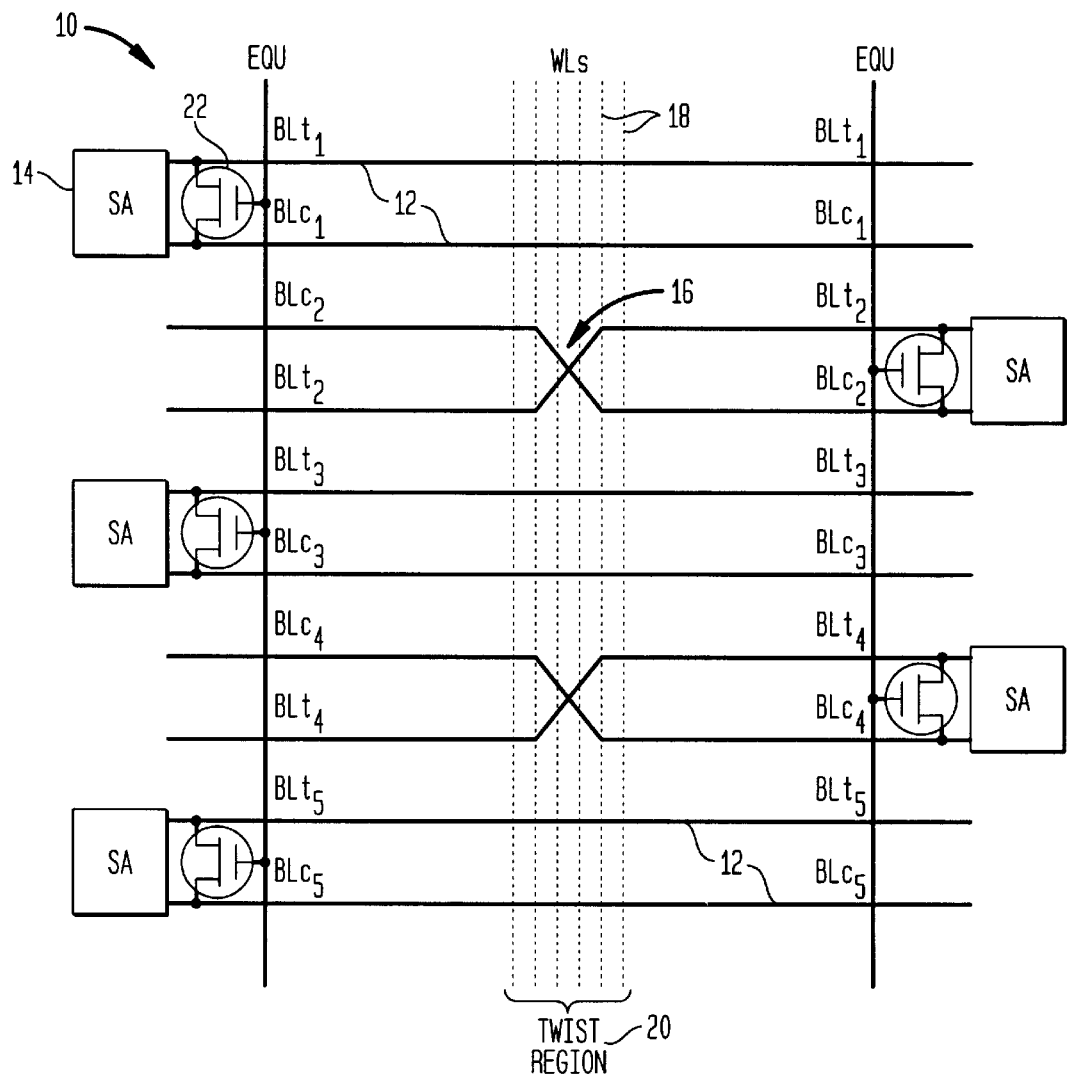
FIG. 1 is a schematic diagram showing a conventional bitline architecture with dummy wordlines in a twist region.
Figure 2:
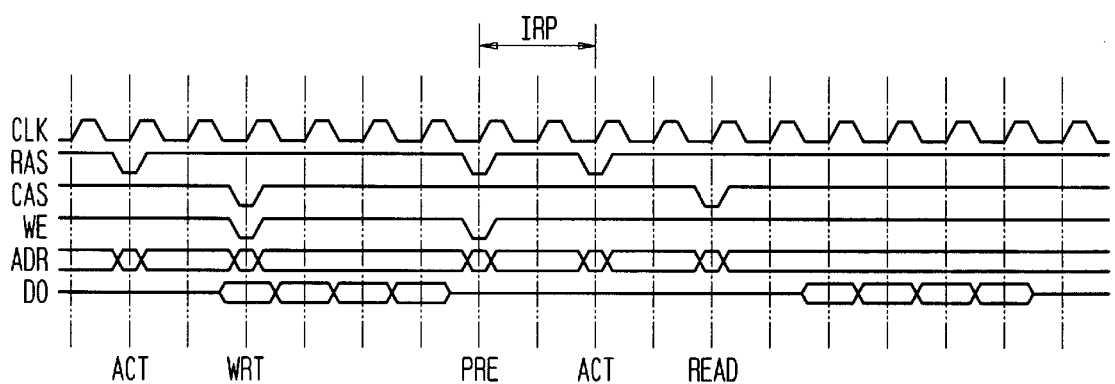
FIG. 2 is a timing diagram showing delay time for an equalize function in accordance with the prior art.

In this embodiment, transistors 112 are located in twist region 110. Advantageously, twist region 110 is located at approximately midway along bitlines 102 between sense amplifiers and ends 115 of the bitlines. One benefit of having additional equalize transistors 112 includes reducing the RC constant (e.g., time delay) needed for equalization. As described above with reference to FIG. 2, the time needed to equalize the BL's, especially for long bitlines (e.g., 512 bits/BL architectures), before the next activate (ACT) command can be issued, limits chip performance. In the illustrative embodiment of FIG. 3, the time needed to equalize the BL's is roughly cut in half, since each transistor (transistor 112 and 116) has to equalize half of the bitline pair. Reducing tRP (see FIG. 4) increases chip performance by decreasing the amount of time needed before the next activate command (ACT). This amount of time need not be an entire cycle and may include other length of time.

Figure 4:
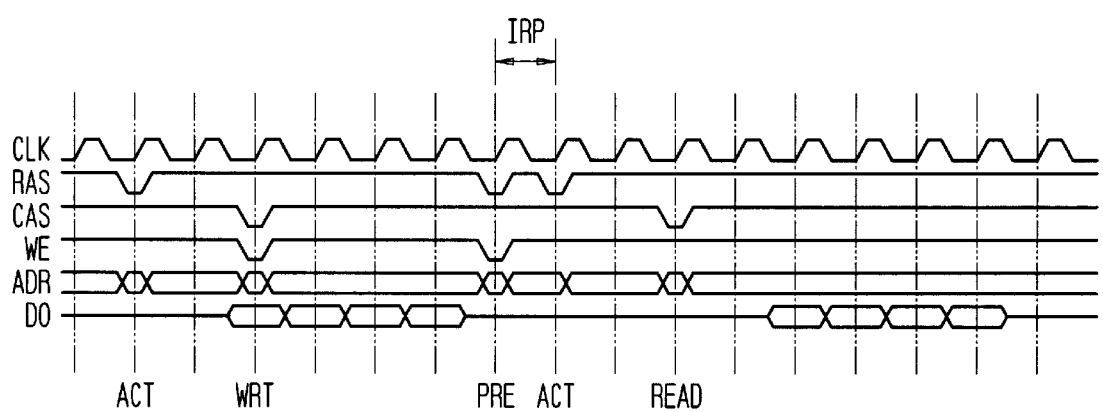
FIG. 4 is a timing diagram showing tRP reduced by an entire cycle for an equalize function in accordance with the present invention.

Referring to FIG. 4, an illustrative timing diagram is shown for employing BL's in accordance with the present invention. The following signals are represented: a global clock signal (CLK), a row address strobe (RAS), a column address strobe (CAS) a write enable (WE), an address line (ADR) and an output line signal (DQ). The following commands are also shown: activate (ACT), precharge (PRE), write (WRT) and read (READ). tRP represents the time it takes to equalize BL's before the ACT command. Comparing FIG. 4 with FIG. 2, tRP is reduced by one-half in the embodiment shown. The decrease in tRP is preferably at least a few nanoseconds depending on the chip design, and clock specifications. A performance boost of even a few nanoseconds is significant considering that millions of access cycles are performed in a few seconds. The performance boost could be distributed to increase the overall access speed or speed yield of the semiconductor chip.

A plurality of different options may be realized for the layout of the present invention. These options depend on for example, a particular twist design or design rule constraints (See e.g., Dong-Sun Min, "Multiple Twisted Dataline Techniques for Multigigabit DRAM's," IEEE Journal of Solid State Circuits, Vol. 34, No. 6, June 1999, and U.S. Pat. No. 5,534,732 to DeBrosse et al.). One skilled in the art would be able to adapt the present invention to many different designs. For example, in the illustrative embodiment described above, sufficient space is provided if at least a 6 wordline pitch space is consumed by the bitline twist. Equalize transistors 112 may be placed in larger or smaller regions. In addition, access to gates of equalize transistors 112 may be provided in a wordline stitch gap.

Figure 5:
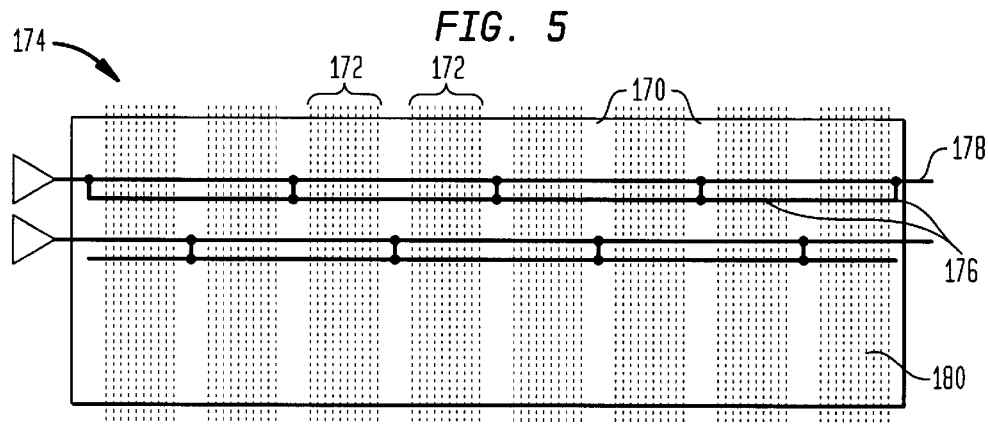
FIG. 5 a schematic diagram of a wordline stitch gap is shown providing a region to connect an equalize line to equalize transistors function in accordance with the present invention.

Referring to FIG. 5, a wordline stitch gap 170 is shown in between groups of bitlines 172. Wordline stitch gap 170 is a layout area in an array 174 where wordlines 176 are connected to metal lines 178. No bitlines 180 are present in these gaps 170 which permits connections between the EQU line and equalize transistors 112 (FIG. 3) to global metal lines 178.

Transistors 112 are illustratively shown in FIG. 3 on the left side but may be located on the right side or alternate between the left side and the right side as shown in FIG. 6. In other embodiments, all equalizing transistors (112 and 116) are located in the twist region 110. In addition, multiple equalizing elements (transistors) may be positioned in twist region 110 and employed to couple a same bitline pair.

Referring to FIG. 7, a schematic diagram of another embodiment of the present invention is shown. In this embodiment, additional equalize transistors 212 are provided in region 110. Transistors 212 are connected across adjacent BLt's and adjacent BLc's, respectively, between bitline pairs. These additional transistors 212 provide greater equalization between bitline pairs to ensure that charge imbalance is removed from all bitlines. Transistors 212 are enabled by EQU. When activated transistors 212, 112 and 116 conduct causing all connected bitlines short against each other.

Having described preferred embodiments for bitline twist with equalizer function (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor device, comprising:
   a plurality of bitlines arranged in an array, the plurality of bitlines being grouped in pairs and at least some of the bitlines include a twist;
   a twist region disposed along the plurality of bitlines wherein the twist region occupies layout area designated for the twists; and
   an equalizer element disposed in the twist region for equalizing a pair of bitlines.

2. The device as recited in claim 1, wherein the equalizer element includes a transistor coupled between the pair of bitlines.

3. The device as recited in claim 1, further comprising additional equalizer elements disposed near sense amplifiers of the plurality of bitlines, the additional equalizer elements being located outside the twist region.

4. The device as recited in claim 3, wherein the additional equalizer elements include transistors.

5. The device as recited in claim 3, wherein the twist region is centrally disposed along a length of the plurality of bitlines and the equalizer element and the additional equalizer element each equalize the pair of bitlines.

6. The device as recited in claim 1, further comprising a plurality of equalizer elements wherein the equalizer elements and the additional equalizer elements are enabled by a same equalize signal.

7. The device as recited in claim 1, wherein the equalizer element includes a dummy component of the semiconductor device adapted to perform an equalizing function for the pairs of bitlines.

8. The device as recited in claim 1, wherein the twist region includes a longitudinal axis disposed substantially perpendicular to a length of the bitlines.

9. The device as recited in claim 8, wherein the twist region includes a width perpendicular to the longitudinal axis and occupying an area of at least one wordline pitch.

10. The device as recited in claim 1, wherein every other pair of bitlines includes a twist.

11. The device as recited in claim 1, wherein all of the pairs of bitlines include a twist.

12. A semiconductor device, comprising:
    a plurality of bitlines arranged in an array, the plurality of bitlines being grouped in pairs and at least some of the pairs of bitlines include a twist;
    a twist region disposed along the plurality of bitlines wherein the twist region occupies layout area designated for the twists;
    a first equalizer element disposed in the twist region for equalizing a pair of bitlines; and
    a second equalizer element disposed in the twist region for equalizing bitlines between pairs of bitlines.

13. The device as recited in claim 12, wherein the first equalizer element includes a transistor coupled between each pair of bitlines.

14. The device as recited in claim 12, wherein each pair of bitlines includes a true bitline and a complement bitline and the second equalizer element includes a transistor coupled between two adjacent true bitlines or two adjacent complement bitlines.

15. The device as recited in claim 12, further comprising a third equalizer element disposed near a sense amplifier of the plurality of bitlines, the third equalizer element being located outside the twist region.

16. The device as recited in claim 15, wherein the third equalizer element includes a transistor.

17. The device as recited in claim 15, wherein the first, second and third equalizer elements are enabled by a same equalize signal.

18. The device as recited in claim 12, wherein the twist region is centrally disposed along a length of the plurality of bitlines and the first and second equalizer elements each equalize the pair of bitlines.

19. The device as recited in claim 12, wherein the first equalizer element includes a dummy component of the semiconductor device adapted to perform an equalizing function for the pairs of bitlines.

20. The device as recited in claim 12, wherein the second equalizer element includes a dummy component of the semiconductor device adapted to perform an equalizing function for the pairs of bitlines.

21. The device as recited in claim 12, wherein, the twist region includes a longitudinal axis disposed substantially perpendicular to a length of the bitlines.

22. The device as recited in claim 21, wherein the twist region includes a width perpendicular to the longitudinal axis and occupying an area of at least about one wordline pitch.

* * * * *